United States Patent
Kobrin

(10) Patent No.: US 8,192,920 B2
(45) Date of Patent: *Jun. 5, 2012

(54) LITHOGRAPHY METHOD

(75) Inventor: Boris Kobrin, Dublin, CA (US)

(73) Assignee: Rolith Inc., Dublin, CA (US)

( * ) Notice: Subject to any disclaimer, the term of this patent is extended or adjusted under 35 U.S.C. 154(b) by 487 days.

This patent is subject to a terminal disclaimer.

(21) Appl. No.: 12/386,899

(22) Filed: Apr. 24, 2009

(65) Prior Publication Data

US 2009/0269705 A1    Oct. 29, 2009

Related U.S. Application Data

(63) Continuation-in-part of application No. PCT/US2008/012901, filed on Nov. 18, 2008.

(60) Provisional application No. 61/125,603, filed on Apr. 26, 2008.

(51) Int. Cl.
*G03F 7/20* (2006.01)
*G03B 27/00* (2006.01)

(52) U.S. Cl. .............. 430/322; 430/270.1; 430/396; 430/5; 355/18

(58) Field of Classification Search .......... 430/270.1, 430/5, 394, 396, 312, 322
See application file for complete search history.

(56) References Cited

U.S. PATENT DOCUMENTS

| | | | |
|---|---|---|---|
| 5,512,131 A | | 4/1996 | Kumar |
| 5,725,788 A | * | 3/1998 | Maracas et al. .......... 216/41 |
| 5,925,259 A | * | 7/1999 | Biebuyck et al. ........ 216/2 |
| 5,928,815 A | | 7/1999 | Martin |
| 6,274,294 B1 | | 8/2001 | Hines |
| 6,344,087 B2 | | 2/2002 | Hein |
| 6,444,254 B1 | * | 9/2002 | Chilkoti et al. .......... 427/2.24 |
| 6,518,168 B1 | * | 2/2003 | Clem et al. .............. 438/623 |
| 6,770,416 B2 | | 8/2004 | Figov |
| 6,808,646 B1 | * | 10/2004 | Jeans ...................... 216/54 |
| 7,144,539 B2 | | 12/2006 | Olsson |
| 7,170,666 B2 | | 1/2007 | Piehl et al. |
| 7,208,788 B2 | | 4/2007 | Hiroshima |
| 7,476,523 B2 | * | 1/2009 | Schueller et al. ........ 435/174 |

(Continued)

FOREIGN PATENT DOCUMENTS

AU    2005213499    8/2005

(Continued)

OTHER PUBLICATIONS

Hiroyuki Sugimura, Oxygen assists vacuum-UV micropatterning of organic surfaces, http://spie.org/x884.4.xml?pf=true&highlight=x2402.

(Continued)

*Primary Examiner* — Amanda C. Walke
(74) *Attorney, Agent, or Firm* — Joshua D. Isenberg; JDI Patent

(57) ABSTRACT

Embodiments of the invention relate to lithography method useful for patterning at sub-micron resolution. This method comprised of deposition and patterning self-assembled monolayer resists using rolling applicator and rolling mask exposure apparatus. Typically the application of these self-assembled monolayers involves contacting substrate materials with a rotatable applicator in the shape of cylinder or cone wetted with precursor materials. The nanopatterning technique makes use of Near-Field photolithography, where the mask used to pattern the substrate is in contact with self-assembled monolayer. The Near-Field photolithography may make use of an elastomeric phase-shifting mask, or may employ surface plasmon technology, where a rotating mask surface comprises metal nano holes or nanoparticles.

20 Claims, 4 Drawing Sheets

U.S. PATENT DOCUMENTS

| | | | |
|---|---|---|---|
| 7,567,774 B2 * | 7/2009 | Yanagihara | 399/237 |
| 7,601,394 B2 * | 10/2009 | Gorman et al. | 427/337 |
| 7,682,540 B2 | 3/2010 | Boyan et al. | |
| 2003/0129545 A1 | 7/2003 | Kik | |
| 2004/0163758 A1 | 8/2004 | Kagan et al. | |
| 2004/0224256 A1 | 11/2004 | Figov | |
| 2004/0257629 A1 | 12/2004 | Noehte et al. | |
| 2005/0048411 A1 | 3/2005 | Leggett | |
| 2005/0196452 A1 | 9/2005 | Boyan | |
| 2005/0202185 A1 | 9/2005 | Greengarde et al. | |
| 2005/0224452 A1 | 10/2005 | Spiess et al. | |
| 2006/0014108 A1 | 1/2006 | Ito et al. | |
| 2006/0072295 A1 | 4/2006 | Goetzen | |
| 2007/0119048 A1 * | 5/2007 | Li et al. | 29/623.5 |
| 2007/0138699 A1 | 6/2007 | Wuister et al. | |
| 2007/0172746 A1 | 7/2007 | Hiroshima | |
| 2007/0200276 A1 | 8/2007 | MacKey et al. | |
| 2008/0056768 A1 * | 3/2008 | Yanagihara | 399/238 |
| 2009/0136679 A1 * | 5/2009 | Boukaftane et al. | 427/510 |
| 2009/0170014 A1 * | 7/2009 | Shibazaki | 430/5 |
| 2009/0269705 A1 | 10/2009 | Kobrin | |
| 2009/0297989 A1 * | 12/2009 | Kobrin | 430/322 |
| 2009/0305513 A1 * | 12/2009 | Kobrin | 438/758 |
| 2010/0018421 A1 * | 1/2010 | Pan et al. | 101/377 |
| 2010/0035163 A1 | 2/2010 | Kobrin | |
| 2010/0123885 A1 * | 5/2010 | Kobrin | 355/53 |
| 2010/0173494 A1 | 7/2010 | Kobrin | |
| 2011/0024950 A1 * | 2/2011 | Kruglick | 264/496 |
| 2011/0210480 A1 | 9/2011 | Kobrin | |

FOREIGN PATENT DOCUMENTS

| | | |
|---|---|---|
| CA | 2558623 | 8/2005 |
| CN | 1735965 | 2/2006 |
| CN | 1943013 | 4/2007 |
| DE | 10233399 | 2/2003 |
| EP | 1786485 | 5/2007 |
| GB | 2395799 | 6/2004 |
| JP | 59200419 | 11/1984 |
| JP | 3043185 | 2/1991 |
| JP | 8288195 | 11/1996 |
| JP | 2001220159 | 1/2001 |
| JP | 2002072497 | 3/2002 |
| JP | 2005043777 | 2/2005 |
| JP | 2006315033 | 11/2006 |
| JP | 2008126370 | 6/2008 |
| WO | 0046641 | 8/2000 |
| WO | 03001869 | 1/2003 |
| WO | 03012549 | 2/2003 |
| WO | 2005077013 | 8/2005 |
| WO | 2008062634 | 5/2008 |
| WO | 2009094009 | 7/2009 |

OTHER PUBLICATIONS

Hiroyuki Sugimura, Micropatterning of alkyl- and fluoroalkylsilane self-assembled monolayers using vacuum ultraviolet light, Langmuir, 16, pp. 885-888, 2000.

J. Schneider, A novel method for the deposition of ultra-uniform resist film for mask making, EMLC 2006, Dresden, Germany, Jan. 23-26, 2006.

Diethard Kapp-Schwoerer, Roller-coating application of liquid photoresists, PCMI Journal No. 77, Jun. 2000.

Non-Final Office Action mailed Sep. 8, 2011; U.S. Appl. No. 12/384,167, filed on Apr. 1, 2009, applicant Rolith.

Hua Tan, Andrew Gilbertson, Stephen Y Chou; Roller Nanoimprint Lithography, J.Vac.Sci. Technol. B 1998 3926-3928.

Yasuhisa Inao, Near-field lithography as prototype nano-fabrication tool, Science Direct, Microelectronic Engineering 84 (2007) pp. 705-710.

Jing Zhao; Localized Surface Plasmon Resonance Viosensors, Nanomedicine 2006, 1(2), p. 219-228.

Peter Forbes; Self-Cleaning Materials: Lotus Leaf-Inspired Nanotechtechnology, Scientific American, Jul. 30, 2008.

Michael Berger; Moth Eyes Self-Cleaning Antireflection Nanotechnology Coatings, Nanowerk, 2008.

D Schaadt; Enhanced Semiconductor Optical Absorption Via Surface Plasmon Excitation in Metal Nanoparticles, Appl.Phys.Lett, 86,063106, 2005.

S Price; Addressable, Large-Area Nanoscale Organix Light-Emitting Diodes, Small, 2007, 3, No. 3, p. 372-374.

S Pillai; Surface Plasmon Enhanced Silicon Solar Cells, J.Appl.Phys, 101, 093105 (2007).

D Derkacs; Improved Performance of Amorphous Silicon Solar Cells Via Scattering From Surface Plasmon Polaritons in Nearby Metalic Nanoparticles, Appl.Phys.Lett, 89, 09310.

Zhaoning Yu; Fabrication of Large Area Subwavelength Antireflection Structures on Si Using Trilayer Resist Nanoimprint Lithgraphy and Liftoff, J.Va.Sci.Techn B21(6).

Guoyong Xie; The Fabrication of Subwavelength Anti-Reflective Nanostructures Using a Bio-Template, Nanotechnology 19(2008) 095605, pp. 1-5.

Paul Roach; Progress in Superhydrophobic Surface Development, Soft Matter, 2008, 4, p. 224-240.

Bruce McLeaod; Thin-Films-Motheye Surfaces Reflect Little Light, Laser Focus World, Diplay Article (36357).

J Wang; Dewetting of Conducting Polymer Inkjet Droplets on Patterned Surface, Nature Materials, V.3, Mar. 2004, pp. 171-176.

L Creagh; Inkjet Printed Electronics: Moving to Production, Printed Electronics USA 2007, Nov. 13-14, San Francisco, CA.

Stephen Y Chou, Peter R Krauss, Preston J Renstrom; Imprint Lithography With 25-Nanometer Resolution, Science Apr. 5, 1996, vol. 272, No. 5258, pp. 85-87.

J.A. Maria A, S.Jeon A, J. Rogers; Nanopatterning With Conformable Phase Masks, Journal of Photochemistry and Photobiology A: Chemistry 166 (2004) 149-154.

Cui, B.; Fabrication of Large Area Nanoprism Arrays and Their Application for Surface Enhanced Raman Spectroscopy, Nanotechnology, vol. 19, No. 14, p. 145302 (6 pages).

Xiangang Luo; Subwavelength Photolithography Based on Surface-Plasmon Polariton Resonance, Opt. Soc. America, Jul. 12, 2004, Optics Express, vol. 12, No. 14, USA.

Kik, P.G.; Metal Nanoparticle Arrays for Near-Field Optical Lithography, Proceeding of the SPIE—the International Society for Optical Engineering, 2002, vol. 4810, pp. 7-13, USA.

Kik, P.G.; Plasmon Priniting—A New Approach to Near-Field Lithography, Nanopatternin—From Ultralarge-Scale Integration to Biotechnology (Materials Research Society Symposium Proceedings vol. 705), 2002, pp. 101-6, USA.

Lin, H.; Localized Surface Plasmon Resonance of Metal Nanodot Nanowire Arrays Studied by Far-Field and Near-Field Optical, National Tsing Hua University, Hsinchu (Taiwan) Department of Materials Science and Engineering, Sep. 5, 2007, Taiwan.

Srituravanich, W,; Sub-100 NM Lithography Using Ultrashort Wavelength of Surface Plasmons, American Institute of Physics Inc., Dec. 1, 2004, USA.

Sheridan, A.K.; Fabrication and Tuning of Nanoscale Metallic Ring and Split-Ring Arrays, Journal of Vacuum Science & Technology B (Microelectronics and Nanometer Structures), Nov. 2007, vol. 25, No. 6, pp. 2628-31, USA.

Takeda, Y.; Surface Plasmon Resonance of Au Nanoparticles Fabricated by Negative Ion Implantation and Grid Structure Toward Plasmonic Applications, Optical Review, Jul.-Aug. 2006, vol. 13, No. 4, pp. 231-4, Japan.

Xiangang Luo; Suface Plasmon Resonant Interference Nanolithography Technique, Applied Physics Letter, Jun. 7, 2004, vol. 84, No. 23, pp. 4780-2, USA.

Shvets, G.; Applications of Surface Plasmon and Phonon Polaritons to Developing Left-handed Materials and Nano-Lithography, Proceeding of the SPIE^the International Society for Optical Engineering, Nov. 3, 2003, vol. 5221, No. 1, pp. 124-32, USA.

McNab, S.J.; Effects of Mask Materials on Near Field Optical Nanolithography, Nanopatterning^ From Ultralarge-Scale Integration to Biotechnology (Materials Research Society Symposium Proceedings vol. 705), 2002, pp. 107-12, USA.

Yang, Yong; Nanolithography in Evanescent Near Field by Using Nano-Filmed Noble Metals Layers, SPIE, Dec. 1, 2007, China.

Sefa-Ntiri, B.; Embedded Metal Mask Enhanced Evanescent Near Field Optical Lithograhy, Proceedings of the 32nd International Conference on Micro-and Nano-Engineering, May 10, 2007, United Kingdom.

Blaber, M.G.; Plasmon Absorption in Nanospheres: A Comparsion of Sodium, Potassium, Aluminium, Silver and Gold, Elsevier, May 15, 2007, Australia.

Xiangang Luo; Subwavelength Photolithography Based on Surface-Plasmon Polariton Resonance, Optical Society of America, Oct. 11, 2004, Optics Express, USA.

Ducker, R.E.; One-Step Photochemical Introduction of Nanopatterned Protein-Binding Functionalities to Oligo (Etylene Glycol)-Terminated Self-Assembled Monolayers, Journal of the American Chemical Society, Dec. 5, 2007, V 129, N 48, P14842+, USA.

Lee, Hyesog; Sub-Diffraction-Limited Optical Imaging With Superlens and Hyperlens, University of California, Los Angeles, vol. 6809B of Dissertation Abstracts International, p. 6252 (118 pages), ISBN: 978-0-549-23309-1, 2007, USA.

Pan, Shanlin; Surface Plasmon Resonance Enhanced Photoluminescence and Applications in Organic Electronics, University of Rochester, vol. 6709B of Dissertations Abstracts International, p. 5095 (186 pages), ISBN: 978-0-542-84717-2, 2006, USA.

Brolo, A.G.; The Development of Surface-Plasmon Sensors Using Arrays of Sub-Wavelength Holes, Proceedings of SPIE, the International Society for Optical Engineering, 2005, USA.

International Search Report and Written Opinion for PCT/US2008/012901 dated Feb. 6, 2009.

Kobrin, Boris; U.S. Appl. No. 60/011,861, filed Jan. 22, 2008.

Chinese First Office Action for Chinese Application No. 200880124519.3 dated Jul. 15, 2011.

Dae-Guen Choi, Jun-Ho Jeong, Young-Suk Sim, Eung-Sug Lee, Woo-Soo Kim, Byeong-Soo Bae; Fluorinated Organic-Inorganic Hybrid Mold as a New Stamp for Nanoimprint and Soft Lithography, Langmuir 2005 9390-9392.

* cited by examiner

LITHOGRAPHY METHOD

This application claims the benefit of U.S. provisional Application No. 61/125,603, filed Apr. 26, 2008 and Continuation in part of PCT/US2008/012901 filed Nov. 18, 2008.

FIELD

Embodiments of the invention relate to nanolithography, the process of patterning nanosize features. More specifically, embodiments describe methods of deposition and patterning of self-assembled monolayers resists.

BACKGROUND

This section describes background subject matter related to the disclosed embodiments of the present invention. There is no intention, either express or implied, that the background art discussed in this section legally constitutes prior art.

Advanced lithography requires nanometer-scale dimensions for the next generation ICs, data storage, LEDs and Solar cells. The sub-100 nm features can be patterned successfully using only very thin resists—nanoresists (<10 nm). Moreover, nanoresists are needed to realize full capability of high resolution lithography, like one using low energy beams patterning or near-field optical lithography. The most widely used method of photoresist deposition is spin-coatings. It involves dispensing controllable amount of photoresist in liquid form onto a rotatable substrate. Photoresist is spreading across the surface of the substrate due to centrifugal forces. For nanoresist thicknesses (<10 nm), spin coating becomes a significant challenge, not only from achieving uniform and reproducible nanothickness using correct and extensive solvent dilution, but also inability to overcome regular defects associated with spin-coating technique: striations, edge bead and streaks. Also, spinning of non-round substrate materials create additional problems with uniformity.

There are known methods of photoresist deposition by roller applicators, for example Roller-coating system RC-4000 from HTP HiTech Photopolymere AG or System suggested by Hein in U.S. Pat. No. 6,344,087. These methods are designed to deposit only relatively thick (microns range) photoresists for Printed Circuit Boards (PCB) patterning.

Nanometrix company has developed a system for nanoresist deposition base on so called continuous coating process, named Schneider-Picard (SP). Method is performed by sliding elements on the surface of a liquid until they meet the ultra thin film formation line. At the same rate the elements are being deposited onto the interface and packed at the formation line, the monolayer is transferred from the liquid surface onto a solid substrate. The whole process works in a dynamic and continuous equilibrium. During the SP method polymer solution is applied at the gas-liquid interface. The receiving phase or the sub-phase is a moving flat liquid. After injection, the polymer solution thins down in different ways depending on the physico-chemical characteristics of the solvents and liquids. Evaporation and immersion are the main ways in which the solvent concentration, after spreading the polymer, fades down from the gas-liquid inter-phase. The pressure applied onto the film's long axis is kept constant while a conveyer transfers the film from the liquid surface toward the solid substrate.

Organic thin films, usually polymers, have been traditionally applied as photoresists for lithography since they can be modified or structured with energetic beams that use photons, electrons, or ions. However, the obtained resolution for such resists is limited by their relatively large thicknesses and intermolecular distances.

For the next generation lithography techniques with expected lateral resolution in the nanometer scale, Self-Assembled Monolayers (SAM) have attracted great attention. SAMs are ordered molecular assemblies formed spontaneously by chemisorption of molecules with suitable anchor groups on a solid surface. They have a stable, homogeneous, oriented, and well ordered molecule structures with a typical thickness of a few nanonieters and an intermolecular spacing on the order of 0.5 nm. Because of their nanometer size thickness and sub-nanometer intermolecular distance, SAMs potential resolution is higher than for polymer resists. Sub-100 nm lithography of SAM can be achieved by soft imprinting lithography, scanning-probe microscopy (SPM) that includes dip-pen or anodic oxidation nanolithography, or by energetic beams, like X-ray or electron beam lithography, or photolithography.

The following 2 methods of SAM deposition are widely used: Liquid phase deposition (using SAM solutions) and Vapor phase deposition (CVD). The first method involves dipping a substrate in a bath contained SAM solution, the second method involves placing a substrate in a vacuum chamber and exposing it to a vapour SAM molecules evaporated from a precursor. Both methods are not suited for coating a large substrates or continuous films during roll-to-roll operation.

Whitesides et al suggested the method of patterning of self-assembled momonlayers using so called, microcontact printing (uContact printing). This method is based on fabricating a mold having desired pattern as a surface relief structure, wetting this relief features with SAM and contacting such mold with the substrate. During such contact SAM molecules are being transferred from the mold onto the substrate material only at the places of the contact, which creates a pattern. This method has limit in resolution caused by molecules transfer in a vapor phase onto the areas between feature, which rapidly washes out the pattern.

SAMs have been successfully patterned using standard photolithography with a photomask. Hiroyuki Sugimura et al. from Nagoya University has reported patterning with features as low as 2 um using UV excimer light at 172 nm and a photomask placed in a contact with SAM.

The same Hiroyoki Sugimura has published Vacuum UV exposure system operating at <200 nm wavelength, which is used in patterning SAM in proximity gap <1 um between a photomask and the SAM.

Though regular optical lithography is limited in resolution by diffraction effects some new optical lithography techniques based on near field evanescent effects have already demonstrated advantages in printing sub-100 nm structures, though on small areas only. Near-field phase shift lithography NFPSL involves exposure of a photoresist layer to ultraviolet (UV) light that passes through an elastomeric phase mask while the mask is in conformal contact with a photoresist. Bringing an elastomeric phase mask into contact with a thin layer of photoresist causes the photoresist to "wet" the surface of the contact surface of the mask. Passing UV light through the mask while it is in contact with the photoresist exposes the photoresist to the distribution of light intensity that develops at the surface of the mask. In the case of a mask with a depth of relief that is designed to modulate the phase of the transmitted light by $\pi$, a local null in the intensity appears at the step edge of relief. When a positive photoresist is used, exposure through such a mask, followed by development, yields a line of photoresist with a width equal to the characteristic width of the null in intensity. For 365 nm (Near UV) light in combination with a conventional photoresist, the width o the null in intensity is approximately 100 nm. A PDMS mask can be used to form a conformal, atomic scale contact with a flat, solid layer of photoresist. This contact is established spontaneously upon contact, without applied pressure. Generalized adhesion forces guide this process and provide a simple and convenient method of aligning the mask in angle and position in the direction normal to the photoresist surface, to establish perfect contact. There is no physical gap with respect to the photoresist. PDMS is transparent to UV light with wavelengths greater than 300 nm. Passing light from a mercury lamp (where the main spectral lines are at 355-365 nm) through the PDMS while it is in conformal contact with a layer of photoresist exposes the photoresist to the intensity distribution that forms at the mask.

Our earlier patent application PCT/US2008/012901 has described high-throughput large area Near-field optical lithography method, which is based on "rolling mask" technique. One of the embodiments involves cylindrical-shaped transparent mask with elastomeric nanostructured film (phase mask) laminated on the surface of such cylinder, and a source of UV light inside such cylinder. Such "rolling mask" is brought in contact with the photosensitive layer and then rolled over the surface of the layer. During this dynamic near-field exposure sub-100 nm features have been written in photoresist. To take full advantage of the near-field optical patterning technique it is desirable to use very thin photoresists. SAMs as monomolecular and conformal layers having 100% uniformity are very promising choice.

Graham Leggett described in US patent application 20050048411 using SAMs as resists for Scanning Near-filed optical lithography (SNFOL). In the case of scanning near-field lithography a narrow optical fiber (having an internal diameter as small as 50 nm) is brought in close proximity to a sample surface. Under such conditions, as result of near-field effect, light may be transmitted through the aperture without diffraction. He demonstrated patterning SAM layers with resolution down to 25 nm using this technique. The downside of the technique is that it is a sequential method (direct writing), so throughput of patterning is very low.

SUMMARY

We suggest a new lithography method comprising of deposition and patterning a self-assembled monolayer using roller contact applicator and rolling mask exposure apparatus. SAMs can be deposited using Rolling application with a cylinder or cone-shaped drum, which is brought in contact with the substrate material. Precursor molecules are chosen to react with the substrate material to form bonding (covalent, coordination or other). Due to self-limiting type of deposition only required amount of material is attached to the substrate during application. Access of molecules attached by physisorption can be removed from the surface by flashing it with solvent. Deposition is performed in a moisture controlled environment.

SAM layer can be patterned using Rolling Mask Near-field optical lithography method. For example, elastomeric UV transparent phase mask is laminated on the surface of transparent cylinder, having UV source inside. Such phase mask can be made of nanostructured PDMS film. Then such cylinder is brought in dynamic contact with the substrate covered with SAM layer. Flow of oxygen can be used to create ozone environment in the place of SAM exposure to accelerate patterning. Alternatively, ozone can be flown to the chamber for same purposes.

In an embodiment of the exposure apparatus which includes surface plasmon technology, a metal layer or film is laminated or deposited onto the outer surface of the rotatable mask, which is typically a transparent cylinder. The metal layer or film has a specific series of through nanoholes. In another embodiment of the surface plasmon technology, a layer of metal nanoparticles is deposited on the transparent rotatable mask's outer surface, to achieve the surface plasmons enhanced nanopatterning. Then such cylinder is brought in dynamic contact with the SAM layer. Flow of oxygen can be used to create ozone environment in the place of SAM exposure to accelerate patterning. Alternatively, ozone can be flown to the chamber for same purposes.

BRIEF DESCRIPTION OF THE DRAWINGS

So that the manner in which the exemplary embodiments of the present invention are attained is clear and can be understood in detail, with reference to the particular description provided above, and with reference to the detailed description of exemplary embodiments, applicants have provided illustrating drawings. It is to be appreciated that drawings are provided only when necessary to understand exemplary embodiments of the invention and that certain well known processes and apparatus are not illustrated herein in order not to obscure the inventive nature of the subject matter of the disclosure.

In FIG. 8, the substrate is a film 5 upon which a pattern is imaged by radiation which passes through surface relief 2 on a first (transparent) cylinder 3 while film 5 travels from roll to roll. A second cylinder 6 is provided on the backside of film to control the contact between the film 5 and the first cylinder 3.

DETAILED DESCRIPTION OF EXEMPLARY EMBODIMENTS

As a preface to the detailed description, it should be noted that, as used in this specification and the appended claims, the singular forms "a", "an", and "the" include plural referents, unless the context clearly dictates otherwise.

When the word "about" is used herein, this is intended to mean that the nominal value presented is precise within ±10%.

Embodiments of the invention relate to methods useful in the deposition and nanopatterning of self-assembled monolayers (SAMs), where a rotatable applicator is used to deposit SAM onto the substrate surface, and then rotatable mask is used to image SAM layer.

Figure 1:
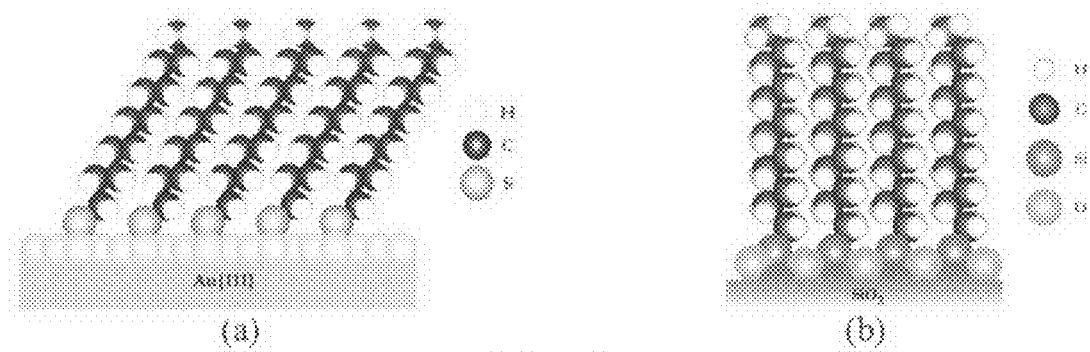
FIG. 1 Schematics of typical Self-assembled Monolayers: an n-dodecanethiolate monolayer self-assembled on an atomically flat gold substrate (a) and organosilane self-assembled on a $SiO_2$ substrate (b)., where H-hydrogen, C-Carbon, S-sulfur, Si-silicon, O-oxygen. SAM molecule shown on FIG. 1 a) is thiol molecule, which is formed a bond with the gold substrate. SAM molecule shown on FIG. 1 b) is alkylsilane molecule, which formed a covalent bond with the silicon oxide substrate material. Due to self-limiting nature of SAM deposition, thickness of such nanoresist is equal to a single molecule height (corrected to the angle of molecule inclination against the surface). Moreover, due to surface reaction mechanism of molecule's attachment to the surface, SAL layer is very conformal to the surface relief.
Figure 2:
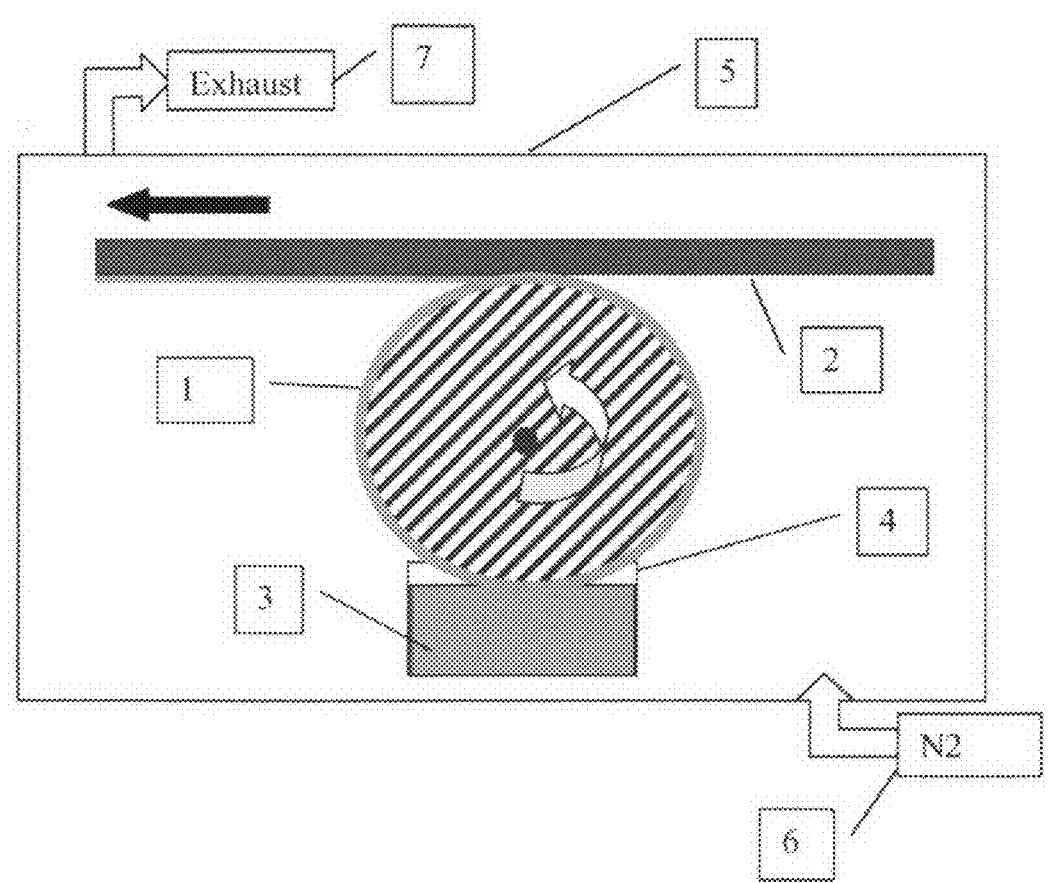
FIG. 2 Schematics of the apparatus for deposition a nanoresist on one side of a substrate, where applicator 1 in the shape of cylinder or cone is brought in dynamic contact with the substrate 2 on one side, and reservoir 4 with SAM precursor 3 on the other side. The deposition apparatus is enclosed in the enclosure 5 having supply of Nitrogen 6 with controllable amount of moisture, and an exhaust 7.

Continuous layer of SAM nanoresist can be deposited onto rigid and flexible substrate materials using "rolling" application. Suggested "rolling" application can be implemented using a cylinder or cone-shaped applicators. FIG. 2 represents a cross-section view of the applicator in the form of cylinder 1, which is brought in contact with the substrate 2 on one side and with a liquid 3 stored in a bath 4, on the other side. When substrate is brought in contact with cylinder and moved linearly, for example, right to left, it turns cylinder counter clock-wise.

Alternatively, cylinder can be rotated separately in-synch with the sample movement. During such rotation cylinder picks up liquid from the bath and transfers it to the substrate's surface. If the pair of materials, substrate material, and SAM precursor, are having reactive groups, once SAM is transferred from the applicator to the substrate surface, SAM molecules start to order itself into a self-assembled "carpet" of molecules aligned to each other. Rotational speed is adjusted to have enough time for completion of self-assembly process. Alternatively, multiple cylinders are used in sequence to increase the duration of substrate contact with the precursor.

SAM precursor molecule's head group is chosen to react with the bonds on the substrate surface with formation of covalent bond or just van-der-Waals attraction. For example, thiols will bond to noble metals with relatively strong attraction, and silanes will bond to oxide surfaces by covalent bonding. Due to self-limiting nature of self-assembly only one molecular layer will be bound to the substrate, which is limiting the thickness of SAM to the height of the molecule of SAM precursor.

An applicator could be made of soft material capable of swelling by precursor liquid, such soft material can for example be polydimethylsiloxane (PDMS) material. Liquid can be supplied to the applicator by soaking in a bath or continuous dripping from a bath. Since most of SAM precursor liquids are quite sensitive to moisture, deposition is set in an enclosure 5 having continuous supply of dry nitrogen 6 and an exhaust 7. Such nitrogen supply can include small controllable amount of moisture to accelerate bonding reaction of SAMs when hydrolazable precursors are chosen. For example, if chlorosilane precursors are used, small controllable amount of moisture will accelerate hydrolysis of the headgroup yielding silanol group, which will effectively bond to some dangling bonds on the substrate surface.

SAM deposition can be accomplished using a wide variety of organic precursors. It is desirable to use monofunctional precursors in order to avoid possibility of bonding molecules with both ends to the substrate, which would interfere with self-assembly and cause defects. Different precursors can be used for this purpose, depending on substrate material. For example, for noble metal substrates, like Au, Ag, Pt, and also Cu, Ni, Zn, Ru, Zn, Ge and many other materials R—SH ligand is used, for example alkylthiols; on Si, $SiO_2$, $TiO_2$, $Fe_2O_3$, other oxides, R—OH ligand is used, which can be implemented through hydrolysis of alkylsilane precursors in the presence of moisture. Other side of the molecules can be any alkyl terminal group, for example $CH_3$ or $CF_2$ Some examples of useful precursors are: octadecyltrichlorosilane (OTS), octyltrichlorosilane (OTCS), dodecyltrichlorosilane (DDTCS), dimethyldichlorosilane (DDMS), tridecafluoro-1,1,2,2-tetrahydrooctyltrichlorosilane (FOTS), heptadecafluoro-1,1,2,2-tetrahydrodecyltrichlorosilane (FDTS), (tridecafluoro-1,1,2,2,-tetrahydrooctyl) trisdimethylamino silane (PF8TAS), (heptadecafluoro-1,1,2,2,-tetrahydrodecyl) trisdimethylamino silane (PF10TAS), octylsilane, n-dodecanethiolate, n-octadecanethiol, etc..

Since most of SAM precursor liquids are quite sensitive to moisture, deposition is set in an enclosure 5 having continuous supply of dry nitrogen 6 and an exhaust 7. Such Nitrogen supply can include small controllable amount of moisture to accelerate bonding reaction of SAMs when hydrolazable precursors are chosen. For example, if chlorosilane precursors are used, small controllable amount of moisture will accelerate hydrolysis of the headgroup yielding silanol group, which will effectively bond to some dangling bonds on the substrate surface. This is accomplished by performing rolling application process in the presence of constant flow of nitrogen or other inert gas having controllable moisture content.

Figure 3:
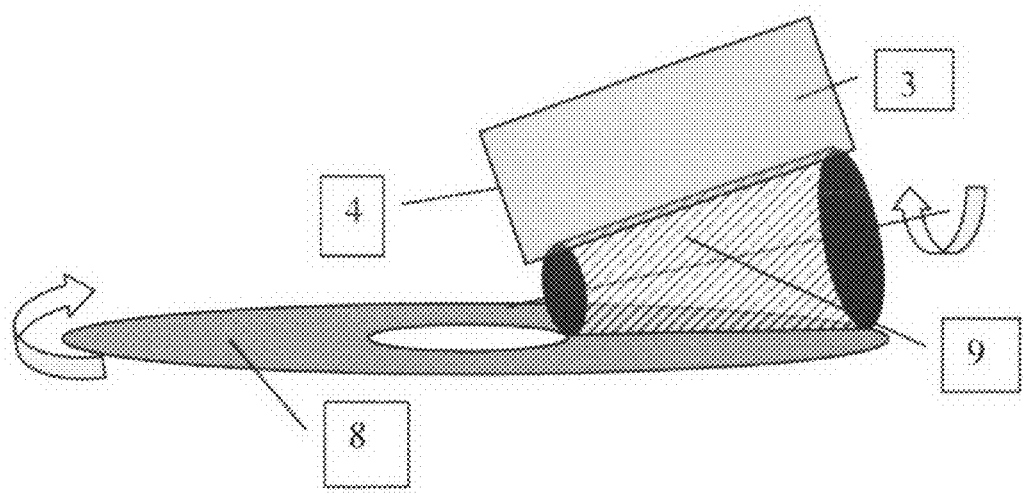
FIG. 3 represents schematic of rolling SAM application onto a disk substrate 8, where applicator is manufactured in a shape of a cone 9. This cone is brought in contact with a SAM precursor liquid 3 stored in a bath 4, and at the same time the cone 9 is rolled on the surface of a disk 8. The most useful embodiment is when the axis of the cone is static but disk substrate is rotating synchronous to rotation of the cone.

FIG. 3 represents schematic SAM application onto a disk substrate 8, where applicator is manufactured in a shape of a cone 9. This cone is brought in contact with a SAM precursor liquid 3 stored in a bath 4, and at the same time the cone 9 is rolled on the surface of a disk 8. The most useful embodiment is when the axis of the cone is static but disk substrate is rotating synchronous to rotation of the cone.

Figure 4:
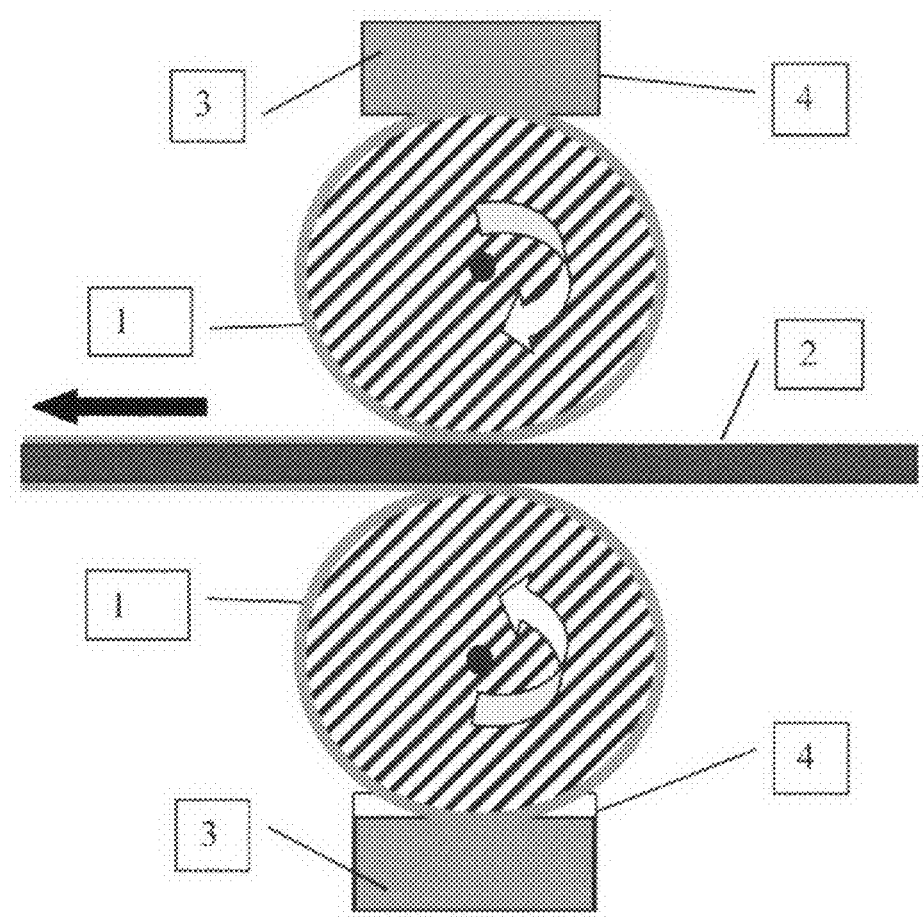
FIG. 4 Schematics of the apparatus for deposition a SAM on both sides of the substrate, where applicator 1 in the shape of cylinder or cone is brought in dynamic contact with the substrate 2 on one side, and reservoir 4 with SAM precursor 3 on the other side. The same set of objects exists on the other side of the substrate providing deposition on both sides of the substrate.

FIG. 4 represents SAM resist deposition on both sides of the substrate 2 using two cylindrical applicators 1, one of which is rotating in clockwise direction, another in counter clock wise direction, and the substrate is moving right to left.

Figure 5:
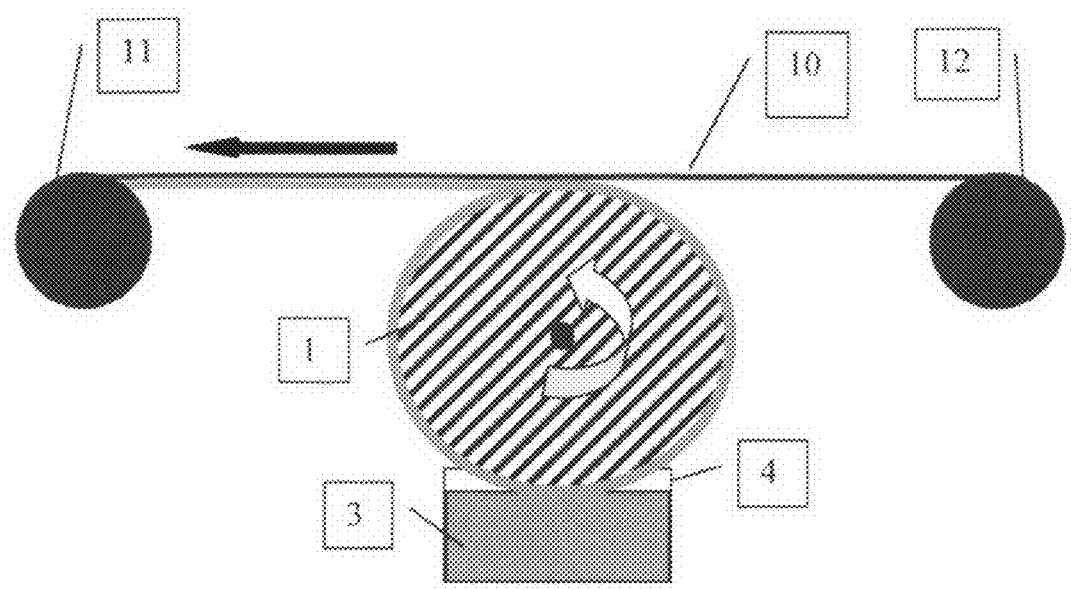
FIG. 5 Schematics of the apparatus for deposition a SAM layer on one side of a film 10, which is translated from in Roll 11 to roll 12, where applicator 1 in the shape of cylinder or cone is brought in dynamic contact with the film 10 on one side, and reservoir 4 with SAM precursor 3 on the other side.

FIG. 5 represents an embodiment where substrate is a film 10, which is rolled from one roll 11 to another roll 12 once in a contact with rotating cylinder applicator 1, wetted by the SAM precursor 3 from the bath 4.

Figure 6:
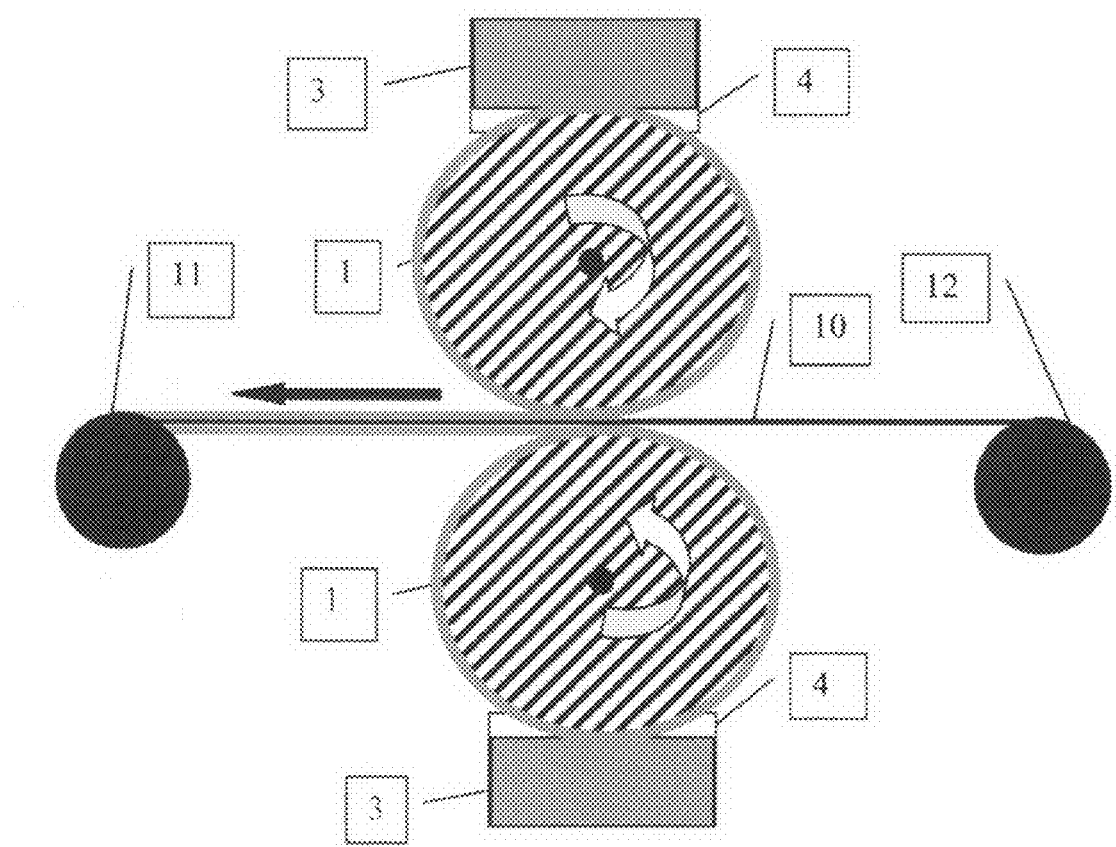
FIG. 6 Schematics of the apparatus for deposition a SAM layer on both sides of a film in Roll-to-Roll mode, where applicator 1 in the shape of cylinder or cone is brought in dynamic contact with the film 10 on one side, and reservoir 4 with SAM precursor 3 on the other side. The same set of objects exists on the other side of the substrate providing deposition on both sides of the film 10.

FIG. 6 represents Roll-to-roll SAM coating deposition on the both sides of the film 10 using 2 cylindrical applicators 2, wetted with SAM precursor liquid 4 from a bath 3.

Substrate or film after SAM deposition can be further flashed with solvents, like alcohols, to remove loosely bound access molecules Substrate or film after SAM deposition can be further heat treated by blowing hot inert gas (nitrogen) or by exposure to Infrared light using lamps to accelerate cross-linking and stabilize the layer.

Another embodiments of the invention relate to methods useful in the patterning of self-assembled monolayers deposited on substrate materials, where a rotatable mask is used to image a SAM layer. Typically the rotatable mask comprises a cylinder or cone. The patterning technique makes use of near-field photolithography, where the wavelength of radiation used to image SAM layer is 650 nm or less, and where the mask used to pattern the disk is in contact with the substrate. The near-field photolithography may make use of a phase-shifting mask, or nanoparticles on the surface of a transparent rotating mask, or may employ surface plasmon technology, where a metal layer on the rotating mask surface comprises nano holes. The detailed description provided below is just a sampling of the possibilities which will be recognized by one skilled in the art upon reading the disclosure herein.

Although the rotating mask used to generate a nanopattern within a SAM layer may be of any configuration which is beneficial, and a number of these are described below, a hollow cylinder or cone are particularly advantageous in terms of throughput and cost.

Figure 7:
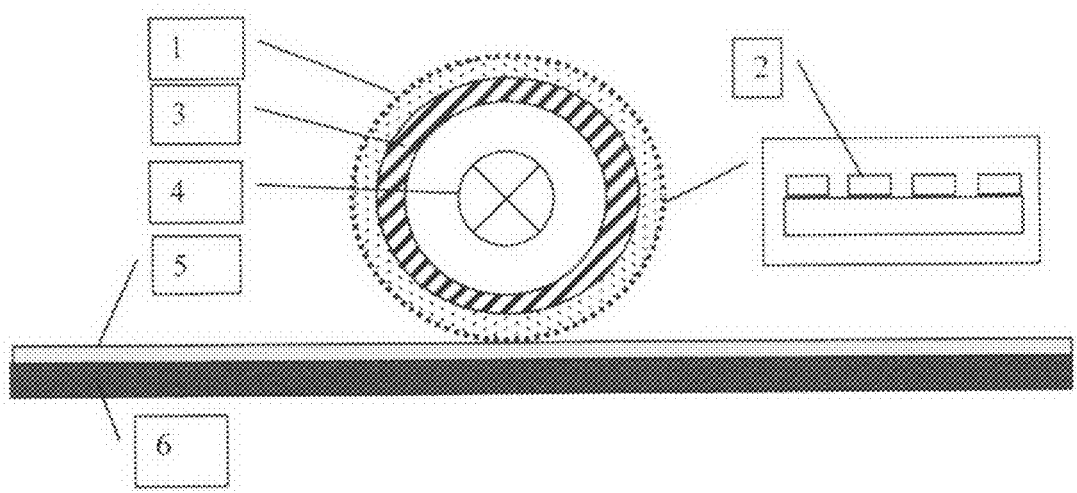
FIG. 7 shows a cross-sectional view of one embodiment of an apparatus useful in patterning SAM, where a radiation transparent cylinder 3 has a hollow interior in which a radiation source 4 resides. In this embodiment, the exterior surface 1 of the cylinder 3 is patterned with a specific surface relief 2. The cylinder 3 rolls over a SAM layer 5 which overlies a substrate 6.

FIG. 7 shows a cross-sectional view of one embodiment of an apparatus useful in patterning a SAM layer 5 deposited on the substrate 6, where a radiation transparent cylinder or cone 3 has a hollow interior in which a radiation source 4 resides. In this embodiment, the exterior surface I of the cylinder or cone is patterned with a specific surface relief 2. The cylinder or cone rolls over SAM layer 5 which overlies a substrate 6. The rotatable cylinder or cone 3 and the substrate 6 are shown to be independently driven relative to each other. In another embodiment, the substrate 6 may be kept in dynamic contact with a rotatable cylinder or cone 3 and moved in a direction toward or away from a contact surface of the rotatable cylinder or cone 3 to provide motion to an otherwise static rotatable cylinder or cone 3. In yet another embodiment, the rotatable cylinder or cone 3 may be rotated on a substrate 6 while the substrate is static.

The specific surface relief 2 may be etched into the exterior surface of the transparent rotating cylinder or cone 3. In the alternative, the specific surface relief 2 may be present on a film of polymeric material which is adhered to the exterior surface of rotating cylinder or cone 3. The film of polymeric material may be produced by deposition of a polymeric material onto a mold (master). The master, created on a silicon substrate, for example, is typically generated using an e-beam direct writing of a pattern into a photoresist present on the silicon disk. Subsequently the pattern is etched into the silicon disk. The pattern on the silicon master mold is then replicated into the polymeric material deposited on the surface of the mold. The polymeric material is preferably a conformal material, which exhibits sufficient rigidity to wear well when used as a contact mask against a disk, but which also can make excellent contact with the radiation-sensitive material on the disk surface. One example of the conformal materials generally used as a transfer masking material is PDMS, which can be cast upon the master mold surface, cured with UV radiation, and peeled from the mold to produce excellent replication of the mold surface.

Figure 8:
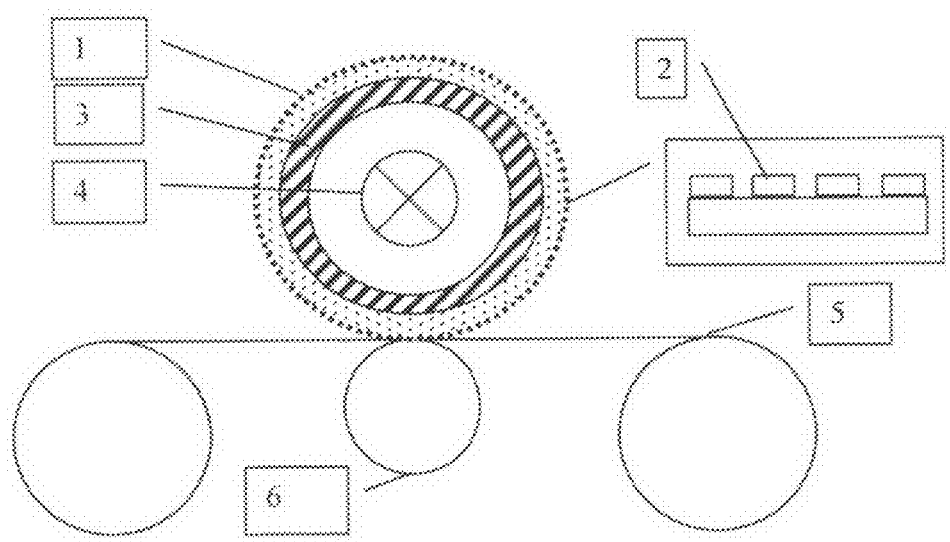
FIG. 8 shows a cross-sectional view of another embodiment of an apparatus useful in patterning SAM layer.

FIG. 8 shows a cross-sectional view of another embodiment of an apparatus useful in patterning SAM layer. In FIG. 8, the substrate is a film 5 upon which a pattern is imaged by radiation which passes through surface relief 2 on a first (transparent) cylinder 3 while film 5 travels from roll to roll. A second cylinder 6 is provided on the backside of film to control the contact between the film 5 and the first cylinder 3. The radiation source 4 which is present in the hollow space within transparent cylinder 3 may be a mercury vapor lamp or another radiation source which provides a radiation wavelength of 365 nm or less. The surface relief 2 may be a phase-shift mask, for example, where the mask includes a diffracting surface having a plurality of indentations and protrusions, as discussed above in the Background Art. The protrusions are brought into contact with a surface of Self-assembled monolayer, and the surface is exposed to electromagnetic radiation through the phase mask. The phase shift due to radiation passing through indentations as opposed to the protrusions is essentially complete. Minima in intensity of electromagnetic radiation are thereby produced at boundaries between the indentations and protrusions. An elastomeric phase mask conforms well to the surface of the SAM, and as a result of features smaller than 100 nm can be obtained.

The SAM patterning does not require any development (in contrast with regular photoresist processing). As a result of photochemical reactions (bond cleavage), exposed molecules leave the surface completely, as in the case of thiols, or leave very thin oxide-like layer in exposed areas, as in the case of alkyl-silanes.

Such photochemical reaction efficiency depends on intensity of UV light and availability of oxidizing molecules (for example, oxygen or ozone), this it is essential to perform this process in an air, containing oxygen, or in oxygen or ozone environment, which can be arranged by flowing these gases in the enclosure where patterning process takes place.

While the invention has been described in detail for a variety of embodiments above, various modifications within the scope and spirit of the invention will be apparent to those of working skill in this technological field. Accordingly, the scope of the invention should be measured by the appended claims.

I claim:

1. A lithography method, comprising:
   a) depositing a self-assembled monolayer on substrate surface;
   b) providing a rotatable mask having a shape of a cylinder or a cone and a nanopattem on an exterior surface of said rotatable mask;
   c) contacting said nanopattem with said self-assembled monolayer;
   d) distributing radiation through said nanopattem, while rotating said rotatable mask over said self-assembled monolayer, whereby an image having a feature size less than 500 nm is created in said self-assembled monolayer.

2. A method in accordance with the claim 1, wherein such depositing a self-assembled monolayer on a substrate, comprising:
   a) providing a substrate,
   b) providing an applicator in a shape of cylinder or cone,
   c) coating this applicator with molecules, terminating at least at one end in a functional group capable to bind to the substrate material,
   d) transferring these molecules from the applicator onto the substrate by rolling said applicator on the surface of the substrate.

3. A method in accordance with claim 2, wherein said molecules terminating at the other end in a functional group not capable to bind to said substrate material, thus molecules are binding to said surface preferentially with only one end and thus form a self-assembled monolayer on said substrate material.

4. A method according to claim 2 wherein said applicator made of a polymer material.

5. A method according to claim 2 wherein said polymer material is a silicone elastomer.

6. A method according to claim 2 wherein coating of said applicator is done by soaking in liquid.

7. A method according to claim 2 wherein said molecules are allowed to swell into said polymer.

8. A method according to claim 2 wherein more than one applicators used sequentially to transfer molecules to said substrate surface.

9. A method according to claim 2, wherein the substrate is static and applicator is moving during said rolling.

10. A method according to claim 2, wherein substrate is moving and applicator position is static during said rolling action.

11. A method according to claim 2, further comprising using an additional applicator positioned on the other side of the said substrate to provide deposition on both sides of said substrate.

12. A method in accordance with claim 2 further comprising providing a controllable moisture containment.

13. A method in accordance with claim 1, wherein said nanopattern is a conformable nanopattern, which conforms to said self-assembled monolayer.

14. A method in accordance with claim 1, wherein said conformable nanopattern is a shaped or nanostructured polymeric material.

15. A method in accordance with claim 1, wherein said rotatable mask is a phase-shifting mask which causes radiation to form an interference pattern in said radiation-sensitive layer.

16. A method in accordance with claim 1, wherein said mask employs surface plasmon behavior.

17. A method in accordance with claim 1, wherein said rotatable mask is a transparent cylinder or cone, whereby radiation may be transmitted from a location interior of said cylinder or cone.

18. A method in accordance with claim 1, wherein said mask is a phase shifting mask which is present on a layer applied over a surface of said cylinder or cone.

19. A method in accordance with claim 1, wherein said substrate is kept in dynamic contact with said rotatable mask during distribution of radiation from the contact surface of said mask.

20. A method according to claim 1 further comprising providing a containment with controllable flow of oxygen or ozone.

* * * * *